United States Patent [19]
Skinner

[11] Patent Number: 5,766,802
[45] Date of Patent: Jun. 16, 1998

US005766802A

[54] PHOTOMASK

[76] Inventor: John G. Skinner, Brook Hollow Rd., Gladstone, N.J. 07934

[21] Appl. No.: 621,144

[22] Filed: Mar. 21, 1996

[51] Int. Cl.[6] .................................. G03F 9/00
[52] U.S. Cl. ...................... 430/5; 430/296; 430/311
[58] Field of Search .................. 430/5, 311, 296; 250/492.2

[56]  References Cited

U.S. PATENT DOCUMENTS

| | | | |
|---|---|---|---|
| 4,523,098 | 6/1985 | Noma | 250/492.2 |
| 5,030,836 | 7/1991 | Kusui et al. | 250/492.2 |

Primary Examiner—S. Rosasco
Attorney, Agent, or Firm—Richard T. Laughlin, Esq.; Graham, Curtin & Sheridan

[57]  ABSTRACT

In accordance with the invention, a mask is produced of high quality and accuracy. This is accomplished by reducing the nominal writing scan width, relative to the total scan width, in an electron or optical beam raster scan pattern generator, and overlapping the adjacent scans by the difference between the writing scan width and the total scan width. When a pattern feature of small size overlaps into adjacent scan areas, the width of the writing scan is increased so the pattern area is within the increased writing scan area. In the case of a large pattern area with only a small portion extending into the adjacent scan area, no increase in the writing scan length is made.

19 Claims, 1 Drawing Sheet

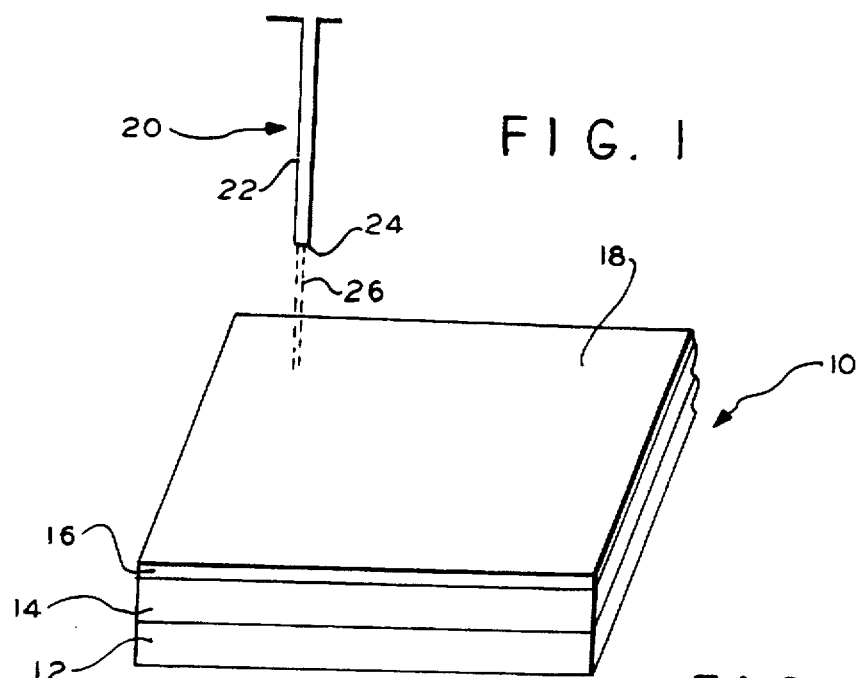
FIG. 1
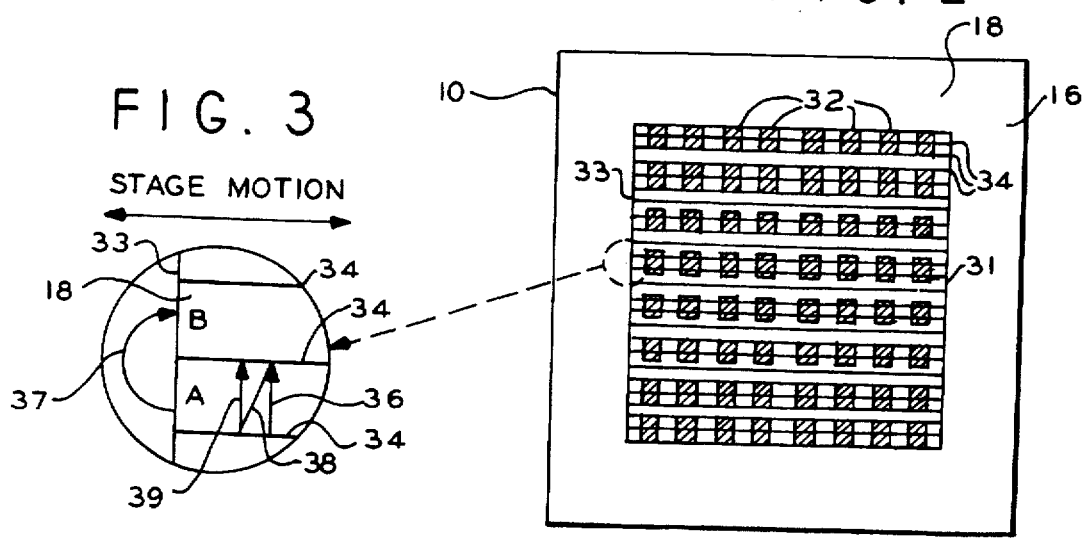
FIG. 2
FIG. 3
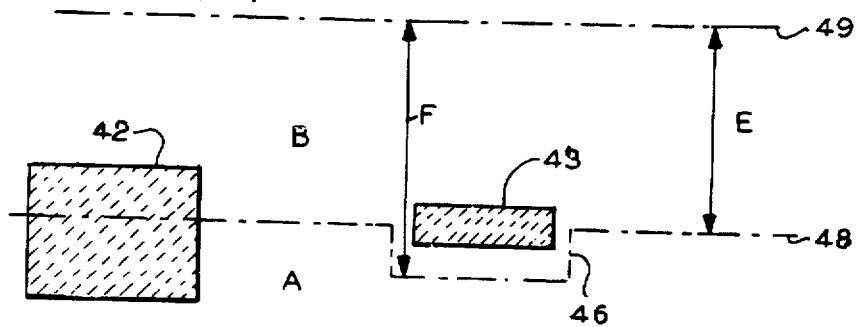
FIG. 4

PHOTOMASK

FIELD OF THE INVENTION

This invention relates to the fabrication of integrated electrical circuits and particularly to a process and apparatus for the preparation of photomasks to improve the quality of such products.

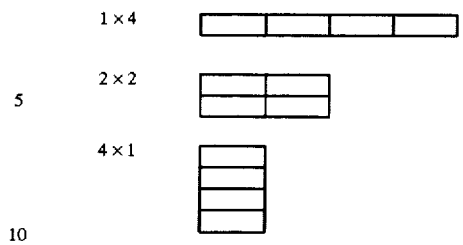

BACKGROUND OF THE INVENTION

In producing integrated circuits it is standard practice to utilize a photomask to form patterns on the surface of silicon wafers. The photomask, which is also referred to as a mask or reticle, conventionally consists of a clear or transparent substrate to the actinic radiation such as borosilicate or quartz, with a thin opaque layer about 100 nm in thickness of chrome and chrome oxides sputter coated on one side of the mask called the active side. The photomask is produced by covering the chrome oxide coating or film with a resist film, such as a film of about 500 nm in thickness. The desired pattern is formed by exposing a series of lines, or trapezoids, on such resist coated substrate, with actinic radiation. The actinic radiation breaks the molecular bonds on the resist coating where it contacts and increases the dissolution rate of the resist thus exposed, when the resist is subsequently immersed in a suitable developer solution. The patterned areas thus formed in the resist, by exposure to the actinic radiation, are removed and the chrome film is etched with an acid. After etching the remaining resist is then removed and the chrome pattern is inspected by subjecting to critical dimension (CD) measurement, and for defects, and is then given a final cleaning.

The pattern areas in the resist are formed by a raster scanning of an optical or electron beam across the active mask face. With an electron beam raster scan pattern generator, such as that sold under the registered trademark MEBES by Etec Systems, Inc., a thin pencil of electrons, typically about 100 to 250 nm in diameter, is scanned in one direction, termed the "Y direction," while the substrate is moved across the electron beam at a right angle to the first direction, termed the "X direction." The electron beam can also be displaced a small amount in the X direction and the total scanned area for the electron beam is typically about 100 µm×500 µm area. The complete pattern, which is typically 100 mm×100 mm, is formed by a combination of the small electron beam displacement and the much larger stage motion of the substrate. The complete pattern has a series of X-directed stripes with the Y-directed electron beam scan. The stripes are written as follows:

| | |
|---|---|
| 0,7 | 1,7 |
| 0,6 | 1,6 |
| 0,5 | 1,5 |
| 0,4 | 1,4 |
| 0,3 | 1,3 |
| 0,2 | 1,2 |
| 0,1 | 1,1 |
| 0,0 | 1,0 |

The pattern memory in MEBES consists of four memory banks, each of which accommodates the data from one pattern stripe. The memory banks can be used in a 1×4 order, a 2×2 order, or in a 4×1 order. The orders can be illustrated as follows:

The selected memory format is determined by the pattern address size and the system scan width that maintains the writing scan distortion to some acceptable level. The maximum writing scan height is about 1 mm. As an example, at 0.1 Au the memory format is 4×1, for a total scan width of 4,096×0.1 µm=409.6 µm=0.4096 mm. At 1.0 µm Au, the memory format is 1×4, for a total scan width of 1,024×1.0 µm=1.024 mm.

The pattern data itself is made up of small segments called pixels, where one pixel represents a single "writing address." The "features" are normally an integer number of pixels collectively. These pattern features are "written" by turning the writing beam on for the required number of addresses. The beam is normally blanked off. The electron beam scans a fixed number of addresses in the Y direction and then retraces to the beginning of the next scan. The required X displacement is a combination of stage motion and X-directed electron beam displacement. The beam scan has a fixed width with its extreme movement in the Y direction referred to as a boundary area, with the area between two sets of boundaries being referred to as a stripe.

Pattern generators, used for writing photomasks typically produce about ten independent machine errors that affect the quality of the finished product. Two significant machine errors are concerns are the stage positioning accuracy and the length of e-beam scan across a stripe, which together determine the separation of adjacent stripes.

In a raster scan pattern generator the width of a feature extending across a scan boundary is dependant on the length of the scan and the accuracy of placing the stripes. If the scan length is short, the feature width is larger than the coded dimension. If the scan length is long, the feature width is smaller.

The typical butting error between two scan stripes or paths, due to scan length over-lap, or under-lap, plus the stripe positioning error, is of the order of 40 µm. This butting error produces a feature which is smaller or larger than a similar feature located near the end of the scan but not on the scan boundary. As is apparent, this feature width variation affects the quality of the completed photomask. There may be as many as 1,000 writing stripes across the face of the mask, depending on the address size, pattern size and the apparatus memory configuration. It is impossible to place critical circuit features throughout the pattern area to avoid these boundary butting errors which directly affects the critical dimensions (CD) of specific circuit features.

There is also a series of random errors caused by variations in the electron beam intensity, resist thickness, chrome thickness, resist development and chrome etch processes. These additional errors can contribute an additional 35 to 45 nm to the CD non-uniformity.

The photomask specification for CD uniformity varies with the circuit design rules. Typical specification values are between 50 to 100 nm. For the leading edge circuit designs, such as the 256M DRAM and 1 G DRAM, the CD uniformity specification is between 25 to 50 nm for design rules down to 0.25 µm.

The butting error specification of 40 nm for a pattern generator is a significant part of CD uniformity specification of 50 nm to 100 nm, which is the allowed error for integrated circuits. The critical features are usually the smaller size features on the mask.

It has been suggested to reduce the butting error by multiple over-lapping scans. This is done by adjusting the position of the writing stripes relative to the pattern and writing the pattern two or more times. This places the butting error in the first scan at a different part of the stripe and reduces the error by averaging. This technique can reduce the CD error due to stripe butting by about 20% to 30% for a double scan writing strategy. The disadvantage is that this double writing adds to the scanning time. Photomasks with critical specifications usually are long writing projects or jobs of about three to four hours and increasing writing time is an expensive solution to the problem.

Some pattern generators form patterns on the mask substrates in various size trapezoids. Such systems are commonly called "shaped beam systems" and have vector scan architecture which has greater flexibility in extending normal writing areas than a raster scan system. The pattern to be scanned is divided into square fields and the writing beam is vectored from one position to the next. In such systems, it has been suggested that if a figure within a field, flows into an adjacent field that figure can be written as a complete figure in one or the other of the adjacent fields.

SUMMARY OF THE INVENTION

It is an object of the invention to provide a system for reducing the writing errors which occur in producing a photomask. Another object of the invention is to provide a method for reducing the writing errors which is easily applied to existing equipment. A further object of the invention is to reduce the writing errors without any significant increase in the time of writing. Other objects and the advantages of the invention will occur to one skilled in the art by the following description of the invention.

In accordance with the invention, writing errors in producing printed circuits are substantially reduced by moving the writing scan boundary around a critical feature and thereby eliminating features which extend over scan boundary areas which is termed a line. This is accomplished with features smaller than a pre-specified dimension which extend over a line at the edge. The small feature is transferred from the lower stripe and allocating it entirely to the upper adjacent stripe and writing entirely within that adjacent stripe. This result is accomplished by reducing the normal writing stripe width by an amount sufficient to exclude all critical features, along the edges of the scan boundary. The length of the writing scan remains the same and writes within the reduced writing stripe width except in the regions where a critical feature is at the edge of the lower stripe which is transferred to the upper stripe by increasing the writing width of the upper stripe. The total scan remains fixed at all times but, due to the overlap, such as, for example, 15 addresses, the beam is turned off, i.e., there is no data, in the upper stripe in the overlap region with the lower stripe, except where a feature is transferred from the lower to the upper stripe.

In accordance with the invention, the apparent variable writing scan width for the raster scan system is achieved by overlapping adjacent scans and only writing in the non-overlapped sections with the exception being where a small feature is transferred from the lower stripe. Data stripes can be overlapped in both Y and X directions to avoid butting errors in both the X and Y directed boundaries.

BRIEF DESCRIPTION OF THE DRAWINGS

FIG. 1 is an illustration, partly in section, of a composite sheet to be made into a photomask, and electron beam scan generator, FIG. 2 is a top view of the composite sheet to be made into a photomask, showing the scan boundaries, stripes and features, FIG. 3 is an enlarged view of one area of FIG. 2 shown in the circle, showing the beam scan system, and FIG. 4 is an illustration of a large and small feature in two adjacent scan paths and stripes.

DESCRIPTION OF THE PREFERRED EMBODIMENT

In accordance with the invention, in preparing a photomask, the writing scan widths are reduced when using an electron or optical beam raster scan pattern generator to generate the photomask. When a pattern feature of small size, termed a "critical feature," overlaps into the adjacent scan area or stripe, the width of the writing stripe is increased in the upper scan area so that the critical feature is within the increased writing scan area and becomes part of that scan. In the case of a large pattern with only a small portion extending into the adjacent scan area, it is unnecessary to make any change in the scan width. This system substantially reduces the errors in the finished photomask caused by the butting error of adjacent writing scans. The changing of the writing width is accomplished by software which eliminates pattern data in the overlap region of the lower portion of each stripe except where a critical feature is located. This can also be done mechanically such as by adjusting the shutter on the beam generating device and then closing the shutter after the desired feature has been scanned. This, in effect, moves the small features into next adjacent scan area. However, the beam generator is normally controlled by computer software which will have inserted in the normal program a signal to increase the beam writing width to encompass a critical feature. The computer program notes where a critical feature extends over a potential boundary line between stripes, and reads it only in the next scan by utilizing an expanded band. One method of preparing the apparatus is to place a grid over the mapping of the features and noting the location of each critical feature so the writing width in the lower scan can be widened to encompass each critical feature in the upper scan and eliminate the portion of the feature that resides in the lower scan.

Referring to the drawings, in FIG. 1, a composite multi-layered sheet which will become the photomask is generally indicated at 10. The composite sheet is made up of three layers. The bottom layer 12 is a transparent material such as quartz or borosilicate glass. The bottom layer is coated or covered by an opaque layer of chrome and chrome oxides 14. This second layer of chrome is conventionally applied by a sputtered coating on the active side of the transparent layer. The top layer covering the chrome layer is a resist coating 16 which will be converted to a more soluble layer in the areas where it is exposed to actinic radiation. The three layer composite sheet 16 is moved in a confined path under an optical or electron beam raster scan pattern generator generally indicated at 20. The beam generator moves the electron beam in the Y direction from the bottom to the top of one stripe and returns on a slight angle to again repeat the scan across the stripe. The stage of the raster scan pattern generator moves relatively slowly in the X direction to maintain the electron beam approximately in the center of its writing region. The combination of the Y scan motion of the electron beam, and the combination of the X direction of the electron beam scan and the X direction of the pattern generator stage, continues until the scan is completed in the X direction. This sequence is repeated until the complete pattern has been scanning across the substrate.

The generator has in its tip 24 a lens, a beam deflection device, and shutter 22. The shutter closes the lens to prevent the beam from passing. The beam 26 passes to the surface 18 of the coated substrate which will become the photomask.

Referring to FIG. 2 a series of pattern features 32 is shown on the resist coating 16. In this illustration, for ease of understanding, the pattern features are shown as a series of uniform squares 32. The stripes in which the composite substrate will be under the beam are indicated as a series of parallel, horizontal lines 34 equally spaced. Each pair of lines defines a stripe.

FIG. 3 illustrates an enlarged section of the area shown in the circle in FIG. 2. Referring to FIG. 3, two adjacent stripes are marked as A and B. The composite substrate 18 is moved so the path of the beam is moved horizontally or in the X direction, from side 31 to side 33. The beam is moved in the Y direction along line 36 extending from one of the horizontal lines to the upper or adjacent horizontal line covering the strip. When the beam reaches the upper boundary, the composite substrate is mover slightly in the X direction and the beam path moves at an angle along an offset path 38 until it reaches the lower boundary of the stripe A and then it again moves straight upward until it again reaches the upper line or boundary of stripe A. The composite substrate is continuously moved in the same manner until the entire area between the lower and upper line has been covered. When the beam reaches the end of the stripe edge 33, the composite substrate is moved along the semi-circular path indicated as 37 and it proceeds to scan the second stripe which is indicated as B. This same procedure is followed until all of the stripes between the horizontal lines have been scanned. During the scanning the beam is allowed to contact the resist coating only when it is over a pixel which is included in a feature.

As illustrated in FIG. 4 two fixtures 42 and 43 are shown between the parallel, horizonal lines 47, 48 and 49 which indicate the extent or boundary of the beam path. Fixture 42 is large and extends over the boundary between two parallel, adjacent paths. This fixture 42 is scanned in the normal path as indicated by the path marked with the letter E. With the small fixture the portion in the lower path in which part of the fixture falls is made part of the upper path by extending the beam path below the boundary line, the total path being illustrated by F. This is done by increasing the writing scan width for this exposure which is indicated by the extended box 46.

With the typical MEBES, the scan length for the 0.1 μm address is 4,096 address units (au). If the critical feature dimension is 1.2 μm (12 au) and located almost entirely in the upper edge of the stripe, all stripe widths are reduced by 15 au. The distance between each stripe must now be set to 4,096 minus 15 or 4081 au. All critical features that fall on the upper edge of the 4081 au stripe width are assigned to the upper adjacent stripe. The upper adjacent stripe is written with data contained in the 4081 au nominal stripe, except if the critical feature has been transferred, then the full scan of 4096 au is employed. The critical feature is then written entirely within one stripe with no effect on the feature width due to scan length errors. In this illustration, the pattern fracturing is completed as follows:

1. The pattern is fractured into 4081 au stripes.

2. Any feature located on the upper edge of a stripe boundary and has a width 12 au (1.2 μm) is assigned to the upper stripe.

3. Each stripe pattern is now amended to exclude partial features from the lower stripe which are then added to the upper stripe.

4. The MEBES pattern memory is loaded with a stripe width of 4096 au containing pattern data in the upper 4081 au and no data in the lower 15 au (i.e., the beam was off), except where pattern data has been transferred from the lower stripe.

5. MEBES then writes in the normal fashion, except the distance between stripes is set at 4081 au instead of the standard 4096 au.

6. All critical features are now contained within a single stripe width.

Because the width of each stripe is reduced in accordance with the invention, the writing time will be longer. As an example, the writing time is increased by 4096 divided by 4081 or about 0.37%. This is less than one minute in a typical four hour operation.

Although the main pattern stripe width has been described as reduced by 15 address units the stripe width can be any value consistent with the size of the critical feature, its exact location relative to the scan boundary, and the acceptable increased writing time. The critical feature can be transferred to either the upper or lower stripe.

In the invention described the nominal stripe width for a 0.1 μm address was given as 4,096 addresses. In practice all patterns are fractured into stripes of 1,024 addresses width and then written as a single 1,024 addresses stripe, or combined into two or four 1,024 address stripes to give stripe width of 2,048 or 4,096 addresses, depending on the address size. For 0.1 μm address, four 1,024 stripes are combined to give a total width of 4,096 addresses. The increase in writing time caused by reducing a 1,024 address stripe by 15 addresses is 1024/1009 or 1.5% increase for a normal writing time of four hours.

All rectangular features within a given stripe are identified by the feature corner location, the feature width and height. The correct placement of the feature data within the core memory is accomplished by the rasterizer and associated electronics. Two adjacent portions of a given rectangular can be stored in random order within the stripe data stream and will be joined together as one rectangle by the rasterizing process. All features completely located within fifteen addresses of the top of the stripe are transferred to the data stream for the upper stripes. Any feature whose dimension extends beyond fifteen addresses from the top of the stripe boundary are retained within the lower stripe data stream. The lower fifteen addresses of the upper stripe will be blank, i.e., contain no pattern data. The addition of the data for the micron size feature from the lower stripe will be transferred to the end, or beginning, of the upper stripe data system.

If the address is 0.5 μm or larger, the normal data stripe would be 1,024 addresses, and the separation between the written stripes would be 1,024 less 15 or 1,009 addresses. If the address is 0.25 μm or less, the written stripe would be 1,024 times 4 or 4,096 addresses. When two or four 1,024 data stripes are combined to form the written stripe the features that were transferred to the upper adjacent stripe are now recombined with the lower strip again. Some redundancy can be avoided if the pattern can be fractured directly into 4,081 address data stripes.

Software can be utilized to control the shutter or the on-off of the beam generator and thereby the action of the optical or electron beam so that the pattern created on the photomask corresponds with the desired circuity. The software has to be modified so that any patterned area of small size which is at the scan barrier will cause the writing scan width to expand to allow the patterned area to be in one scan field. This is done be examining the circuit in relation to the scan fields and inserting the instruction in the software to expand writing field where necessary. The software can follow the steps:

1. Data format as conventionally used in preparing photomasks.

2. Each data stripe is identified by a stripe number, such as 1,4.

3. Each pattern figure within a given stripe is identified by shape, lower location relative to the lower left corner of the stripe, length and width.

4. The figures of interest whether rectangles, or portions of rectangles, are those whose lower left corner are within the specified stripe overlap which are transferred to the upper, adjacent stripe. The software selects rectangular features within the overlap region and transfers them to the adjacent upper stripe.

5. The software will perform the following task:
IF
{ [STRIPE N,M], [RECTANGULAR FIGURE],
[(Y DIMENSION OF LOWER LEFT CORNER LOCATION)—(MAGNITUDE OF WRITING SCAN WIDTH)] >0}
WHERE
(WRITING SCAN WIDTH=TOTAL SCAN WIDTH—OVERLAP)
TRANSFER TO
{ [STRIPE N,(M+b 1)], [RECTANGULAR FIGURE],
[(Y DIMENSION IN STRIPE (N,M))—(WRITING SCAN WIDTH] }, {SAME X LOCATION AS GIVEN IN STRIPE (N,M)}

6. The data for the transferred figure can be added at the beginning or end of the data for the upper stripe, and given the correct location data, its position in the writing pattern will be set by the system's rasterizing engine.

7. The stripe overlap can be in the X or Y direction.

This invention offers a very simple method to eliminate CD variations caused by scan butting errors, which is the major contributor to the total CD variation across a photomask. The invention results in an increase in time necessary to complete the scanning of a given photomask as a ratio of the decreased width of the scan.

While the invention has been described in its preferred embodiment, it is to be understood that the words which have been used are words of description rather than limitation and that changes may be made within the purview of the appended claims without departing from the true scope and spirit of the invention in its broader aspects.

What is claimed is:

1. In the method of preparing a mask containing patterns of small critical features by utilizing a raster-scan energy-beam writing system wherein some of the small critical features extend across the boundries of adjacent stripes formed by the writing system, the improvement which comprises decreasing butting errors and thereby improving the quality of the completed mask, by forming said mask, with small critical features located completely within one of the adjacent stripes by decreasing the nominal writing width and overlapping adjacent stripes, increasing the writing width at only the location of the critical feature which would have a portion of the critical feature extending into the adjacent stripe, so the entire pattern area of the critical feature is within one stripe, and removing the portion of the critical feature from the adjacent stripe.

2. The method as defined in claim 1, wherein the stripe boundary error is eliminated by overlapping the raster beam scan width by a sufficient amount to include the total width of the critical feature in one writing stripe and adjusting the writing scan width to write over a reduced scan width to avoid double exposing the written pattern.

3. The method as defined in claim 1, wherein the stripe boundary error is eliminated by overlapping the raster beam scan width by a sufficient amount to include the total width of the critical feature in one writing stripe and adjusting the writing scan width to write over a full scan width in the regions where a portion of the critical feature is transferred from the lower stripe.

4. The method as defined in claim 1, wherein the reduced writing scan is obtained by eliminating any pattern data in the overlap region in the lower portion of the upper stripe.

5. The method as defined in claim 1, wherein the writing scan is extended to full scan width in the regions where the portions of critical features are transferred from the lower to the upper adjacent stripe, and in said regions all pattern data included in a pre-set width, equal to the overlap of adjacent scans, and a pre-set length of the upper region of the lower stripe, including the portion of the critical feature that crosses the normal stripe boundary, are transferred to the lower region of the upper adjacent stripe.

6. The method as defined in claim 1, wherein the reduced writing scan eliminates any pattern data in the overlapped region in the lower portion of the upper stripe.

7. The method as defined in claim 1, wherein the scan width is 4.081 au and the increased scan width is 4.096 au.

8. The method as defined in claim 1, wherein the beam raster scan pattern generator has an optical beam for the actinic radiation.

9. The method as defined in claim 1, wherein the beam raster scan pattern generator has an electron beam for the actinic radiation.

10. The method as defined in claim 1, wherein the writing scan width remains the same for features of substantial width that cross the scan boundary.

11. The method as defined in claim 1, wherein critical features in the electrical circuit which extend across the scan boundary is transferred from the lower stripe and allocated entirely to the upper adjacent stripe and written entirely within that stripe.

12. The method as defined in claim 1, wherein the writing area is a fixed field area.

13. In the apparatus of producing an integrated electrical circuit of high quality and accuracy having critical features by utilizing a photomask formed by use of an electron or optical beam raster scan pattern generator, the improvement which comprises software means for forming said photomask by decreasing scanning width of the beam raster, increasing the writing scan width of the scan so the pattern area of the critical feature is within the increased writing scan area or stripe and eliminate any portion of the pattern from the adjacent stripe.

14. The apparatus as defined in claim 13, wherein the scan width is 4.081 au and the increased scan width is 4.096 au.

15. The apparatus as defined in claim 13, wherein the beam raster scan pattern generator has an optical beam.

16. The apparatus as defined in claim 13, wherein the beam raster scan pattern generator has an electron beam.

17. The apparatus as defined in claim 13, wherein the scan width remains the same for patterned area of substantial width.

18. The apparatus as defined in claim 13, wherein critical features in the electrical circuit which extend across the scan boundary is transferred from the lower stripe and allocated entirely to the upper adjacent stripe and written entirely within that stripe.

19. In an apparatus for producing an integrated electrical circuit of high quality and accuracy having critical features by utilizing a photomask formed by use of an electron or optical beam raster scan pattern generator, the improvement which comprises means for reducing the writing width of the scan, means for increasing the writing width of the scan at the location of the critical feature so the entire pattern area of the critical feature is within the increased width of the stripe and means for removing from the scan of the adjacent stripe such critical features.

* * * * *